US008952693B2

(12) United States Patent
Lake et al.

(10) Patent No.: US 8,952,693 B2
(45) Date of Patent: Feb. 10, 2015

(54) METHOD FOR PRINCIPAL FREQUENCY MAGNETIC RESONANCE ELASTOGRAPHY INVERSION

(75) Inventors: David S Lake, Rochester, MN (US); Kiaran P McGee, Rochester, MN (US); Armando Manduca, Rochester, MN (US); Yogesh K Mariappan, Rochester, MN (US); Richard L Ehman, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 502 days.

(21) Appl. No.: 13/453,653

(22) Filed: Apr. 23, 2012

(65) Prior Publication Data

US 2012/0268128 A1 Oct. 25, 2012

Related U.S. Application Data

(60) Provisional application No. 61/478,127, filed on Apr. 22, 2011.

(51) Int. Cl.
*G01R 33/563* (2006.01)

(52) U.S. Cl.
CPC ............................ *G01R 33/56358* (2013.01)
USPC ........................................................ 324/309

(58) Field of Classification Search
CPC .............................................. G01R 33/56358
USPC .......................... 324/300–322; 600/410–435
See application file for complete search history.

(56) References Cited

U.S. PATENT DOCUMENTS

| 4,691,162 | A | * | 9/1987 | Van Uijen | 324/309 |
|---|---|---|---|---|---|
| 4,745,364 | A | * | 5/1988 | Hatanaka | 324/309 |
| 5,592,085 | A | | 1/1997 | Ehman | |
| 5,729,694 | A | * | 3/1998 | Holzrichter et al. | 705/17 |
| 5,825,186 | A | | 10/1998 | Ehman et al. | |
| 5,899,858 | A | | 5/1999 | Muthupillai et al. | |
| 5,977,770 | A | | 11/1999 | Ehman | |
| 6,879,155 | B2 | * | 4/2005 | Ehman et al. | 324/309 |

OTHER PUBLICATIONS

Doyle, et al., Adaptive Fourier Threshold Filtering: A Method to Reduce Noise and Incoherent Artifacts in High Resolution Cardiac Images, Magnetic Resonance in Medicine, 1994, 31(5):546-550.
Francos, et al., A Unified Texture Model Based on a 2-D Wold-Like Decomposition, IEEE Transactions on Signal Processing, 1993, 41(8):2665-2678.

(Continued)

*Primary Examiner* — Dixomara Vargas
(74) *Attorney, Agent, or Firm* — Quarles & Brady, LLP

(57) ABSTRACT

A method for calculating a mechanical property of a material using a magnetic resonance imaging ("MRI") system is provided. The method is particularly robust to image data having low signal-to-noise ratio ("SNR"). An MRI system is used to acquire magnetic resonance elastography ("MRE") data from a subject containing the material. Exemplary materials include lung tissue. Images are reconstructed from the MRE data and used to produce a wave image from which a spatial frequency spectrum is produced. A principal frequency of the spatial frequency spectrum is produced and used to calculate a mechanical property of the material. For example, shear stiffness may be calculated.

15 Claims, 3 Drawing Sheets

(56) References Cited

OTHER PUBLICATIONS

Liu, et al., A Spectral 2-D Wold Decomposition Algorithm for Homogeneous Random Fields, M.I.T. Media Laboratory Perceptual Computing Section Technical Report No. 482, Proceedings of the International Conference on Acoustics, Speech, and Signal Processing, Phoenix, Arizona, Mar. 15-19, 1999 (4 pages).

Meyers, Noise and the Discrete Fourier Transform, 2000, 4 pages.

* cited by examiner

METHOD FOR PRINCIPAL FREQUENCY MAGNETIC RESONANCE ELASTOGRAPHY INVERSION

CROSS-REFERENCE TO RELATED APPLICATIONS

This application claims the benefit of U.S. Provisional Patent Application Ser. No. 61/478,127, filed on Apr. 22, 2011, and entitled "METHOD FOR PRINCIPAL FREQUENCY MAGNETIC RESONANCE ELASTOGRAPHY INVERSION."

STATEMENT REGARDING FEDERALLY SPONSORED RESEARCH

This invention was made with government support under EB007593 awarded by the National Institutes of Health. The government has certain rights in the invention.

BACKGROUND OF THE INVENTION

The field of the invention is magnetic resonance imaging ("MRI"). More particularly, the invention relates to magnetic resonance elastography ("MRE").

Magnetic resonance elastography ("MRE") is a phase-contrast MRI technique that is capable of spatially resolving the shear stiffness of biological tissues. MRE provides a sensitive metric for the detection of both benign and malignant processes in tissues such as those in the breast, prostate, heart, skeletal muscle, brain, and liver. These applications of MRE have been applied to organs in which the signal-to-noise ratio ("SNR") is generally considered to be high, both in terms of the magnitude of the MRE signal as well as the phase into which the shear wave displacements are encoded. In contrast, MRE of tissues such as the lung is uniquely challenging due in large part to the decreased SNR of both the magnitude and phase of conventional proton MRE images. This decrease in SNR is due to the decreased physical density of the lung compared to solid organs, and because of the ultra-short transverse relaxation time, $T_2^*$, of lung parenchyma. Decreased physical density reduces the number of protons that contribute to the net signal within each voxel, and hence decreased SNR. The ultra-short $T_2^*$ of lung parenchyma, which is of the order of 1-2 milliseconds, means that significant signal decay occurs during the typical echo time used to acquire the MR signal using conventional pulse sequences. This rapid decay results in further signal loss and SNR degradation. The decrease in SNR is also further exacerbated with increasing inflation pressure, which results in decreased physical density and increased susceptibility-induced signal loss.

Many techniques to calculate shear modulus from MRE wave displacement data have been described, with perhaps the most commonly used being direct inversion of the Helmholtz equation. In moderate-to-high SNR data sets, various inversion methods have been shown to accurately calculate the shear stiffness of tissue like materials; however, as the SNR of the MRE data decreases, direct inversion and other inversion methods can underestimate the value of the shear stiffness, particularly in less elastic materials in which the shear wavelength becomes large compared to the object dimensions.

A common method to calculate the shear stiffness of biological tissue that is more robust to noise is local frequency estimation ("LFE"). This method estimates the local spatial frequency, and hence wavelength and wave speed, over a range of several frequency scales. The shear stiffness is then calculated based on the relationship $\mu=\rho c^2$ between the shear modulus, $\mu$, of a purely elastic material, the density of the material, $\rho$, and the shear wave speed, $c$. This formula assumes no attenuation, and hence the shear stiffness is an effective quantity; that is, the stiffness of a purely elastic material that would give the observed wavelength.

The problem of low SNR becomes particularly important in the case of measuring mechanical properties of the lung. The lung is a relatively inelastic organ in which the density is typically one third that of solid organs and which varies throughout the respiratory cycle due to changes in tidal lung volume. The SNR of MRE lung data is very low due to the lung's low physical density and ultra short $T_2^*$ value. Additionally, a decrease in SNR with increasing lung volume can introduce a pressure-dependent bias in the MRE estimate of shear stiffness, with shear stiffness being increasingly underestimated as lung volume, and hence transpulmonary pressure ("$P_{tp}$"), increases. While it is generally appreciated that lung stiffness is a linear function of $P_{tp}$ with a slope approximately equal to 0.7 (when $P_{tp}$ is measured in centimeters of water), underestimation of shear stiffness with increasing $P_{tp}$ due to decreased SNR will result in an underestimate of this slope. Deviation from the true value of the slope, and hence shear stiffness, will introduce errors that could be misinterpreted as indicative of some disease process, or will affect the diagnostic sensitivity and specificity of MRE-based estimates of shear stiffness.

It would therefore be desirable to provide a method for MRE that is robust to low SNR data sets, such as those acquired from lung tissue.

SUMMARY OF THE INVENTION

The present invention overcomes the aforementioned drawbacks by providing a method for calculating a mechanical property of a material using a magnetic resonance imaging ("MRI") system, in which the method is particularly robust to image data having low signal-to-noise ratio ("SNR") by calculating a spatial frequency of a complex wave image and using the principal frequency of that spatial frequency spectrum to calculate mechanical properties of the material.

It is an aspect of the invention to provide a method for calculating a mechanical property of a material using an MRI system. The method includes using the MRI system to acquire magnetic resonance elastography ("MRE") data from a subject containing the material and reconstructing images from this MRE data. A complex wave image is produced from these reconstructed images and a spatial frequency spectrum is produced from the complex wave image. A principal frequency of the spatial frequency spectrum is calculated and used together with the complex wave image to calculate a mechanical property of the material.

It is another aspect of the invention to provide an MRI system that includes a magnet system configured to generate a polarizing magnetic field about at least a portion of a subject positioned in the MRI system; a plurality of gradient coils configured to establish a magnetic field gradient about at least a portion of the subject positioned in the MRI system; a radio frequency (RF) coil configured to apply an RF field to at least a portion of the subject and to receive magnetic resonance (MR) signals therefrom; and a computer system. The computer system is programmed to direct the plurality of gradient coils and the RF coil to perform a pulse sequence that acquires motion-encoded MR signals from the subject and to reconstruct images from the acquired motion-encoded MR signals.

The computer system is further programmed to produce a spatial frequency spectrum from the reconstructed images, to calculate a principal frequency of the produced spatial frequency spectrum, and to calculate a mechanical property of a tissue in the subject using the reconstructed wave images and the calculated principal frequency.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
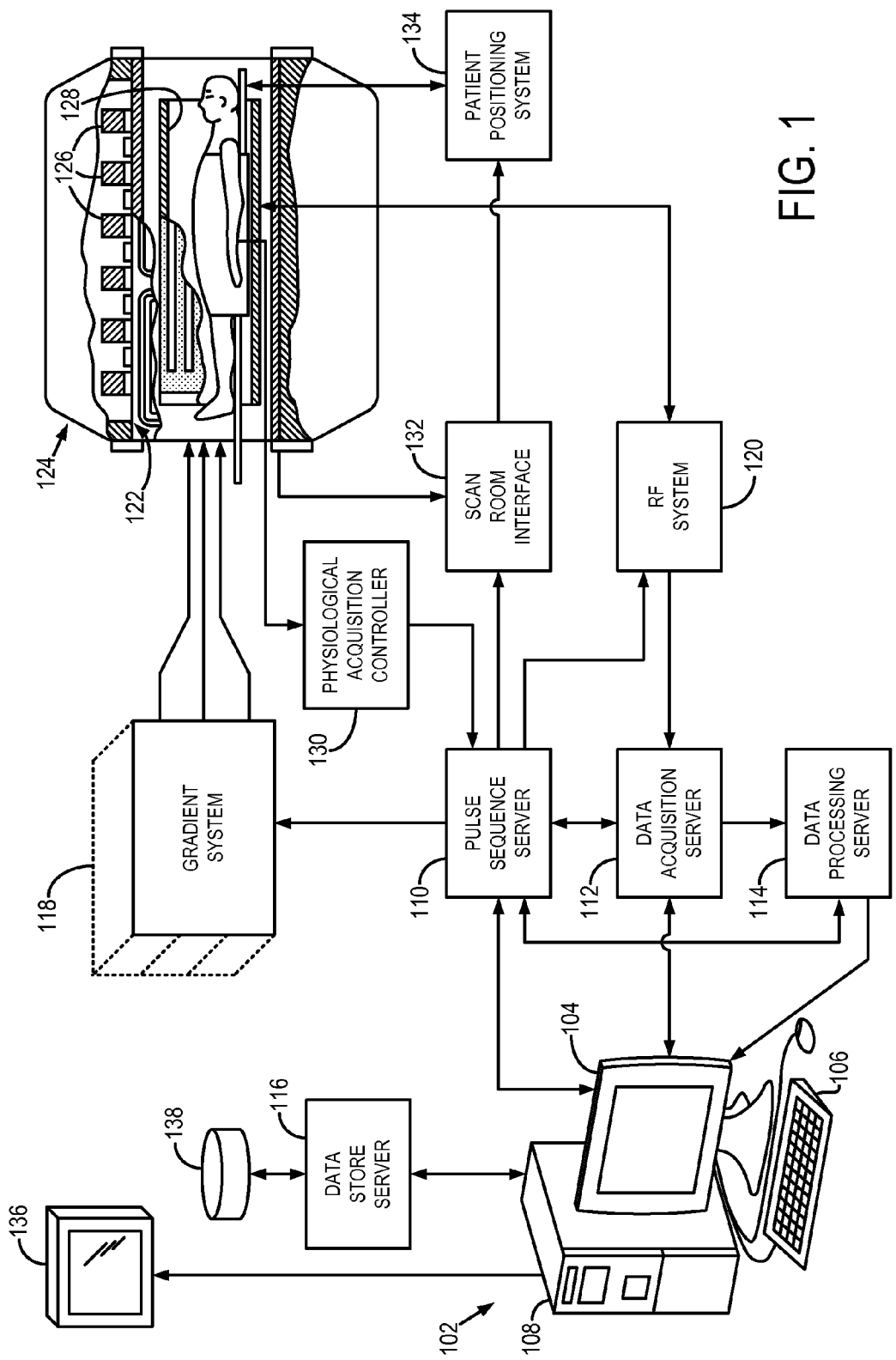
FIG. 1 is a block diagram of an exemplary magnetic resonance imaging ("MRI") system that employs the present invention.

Referring particularly now to FIG. 1, an exemplary magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \tag{1};$$

and the phase of the received MR signal may also be determined:

$$\phi = \tan^{-1}\left(\frac{Q}{I}\right). \tag{2}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
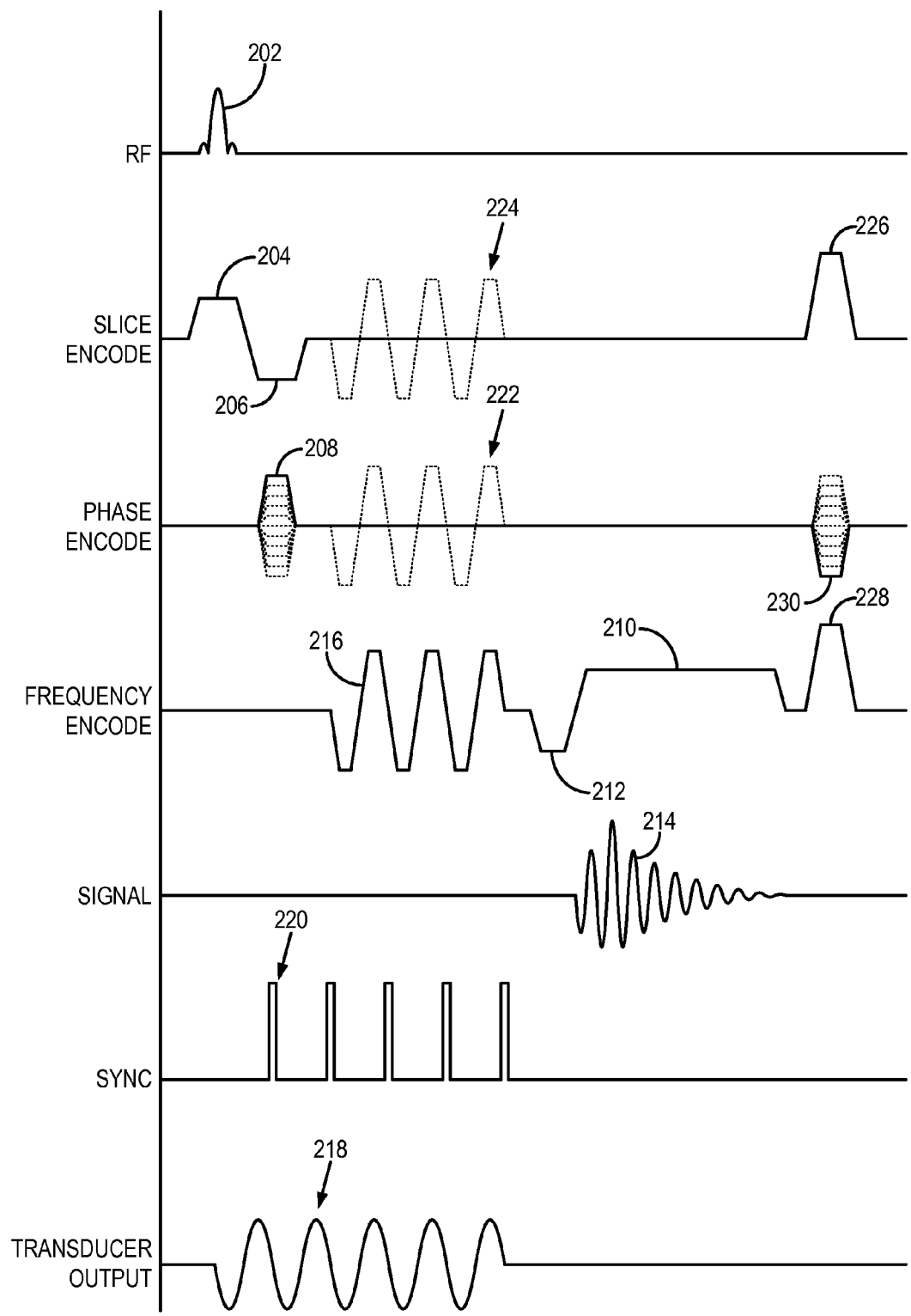
FIG. 2 is a pulse sequence diagram illustrating an exemplary pulse sequence for performing magnetic resonance elastography in accordance with embodiments of the present invention.

Referring particularly to FIG. 2, an exemplary pulse sequence, which may be used to acquire magnetic resonance image data according to embodiments of the present invention, is shown. The pulse sequence is based on a gradient-echo recalled pulse sequence. Transverse magnetization is produced by a radio frequency ("RF") excitation pulse 202 that is produced in the presence of a slice-selective gradient 204. To mitigate signal losses resulting from phase dispersions produced by the slice-selective gradient 204, a rephasing lobe 206 is applied after the slice-selective gradient 204. A phase-encoding gradient 208 is applied at an amplitude and polarity determined by the view number of the acquisition, and prior to a readout gradient 210 that includes a prephasing lobe 212. The readout gradient 210 forms a gradient-recalled echo 214 that is sampled by the MRI system to acquire image data.

Following the application of the phase-encoding gradient 208 and before the application of the readout gradient 210, one or more motion-encoding gradients 216 are played out. For example, as illustrated, a motion-encoding gradient 216 is played out along the frequency-encoding direction. The motion-encoding gradient 216 sensitizes the echo signal 214 to motion occurring along the same direction in which the motion-encoding gradient 216 is applied. The motion-encoding gradient 216 is an alternating gradient having a frequency equal to that of a drive signal that drives an MRE driver to produce oscillatory motion 218 in the subject. During the application of the motion-encoding gradient 216, the pulse sequence server 110 produces sync pulses as shown at 220, which have the same frequency as, and have a specific phase relationship with respect to, the motion-encoding gradient 216. These sync pulses 220 are used to produce the drive signals for the MRE driver to apply the oscillating stress 218 to the subject. To insure that the resulting waves have time to propagate throughout the field of view, the sync pulses 220 may be turned on well before the pulse sequence begins.

The phase of the echo signal 214 is indicative of the movement of the spins. If the spins are stationary, the phase of the echo signal 214 is not altered by the motion-encoding gradient 216, whereas spins moving along the motion-encoding direction will accumulate a phase proportional to their velocity. Spins that move in synchronism and in phase with the motion-encoding gradient 216 will accumulate maximum phase of one polarity, and those which move in synchronism, but 180 degrees out of phase with the motion-encoding gradient 216 will accumulate maximum phase of the opposite polarity. The phase of the acquired echo signal 214 is, thus, affected by the "synchronous" movement of spins along the motion-encoding direction.

The pulse sequence in FIG. 2 can be modified to measure synchronous spin movement along any number of different directions. For example, the motion-encoding gradient 216 may be applied along the phase-encoding direction, as indicated by dashed lines 222, or they may be applied along the slice-encoding direction, as indicated by dashed lines 224. Indeed, motion-encoding gradients 216 may be applied simultaneously to two or three of the gradient field directions to encode synchronous spin movements along any desired direction.

The pulse sequence is concluded with the application of spoiler gradient pulses 226 and 228 along slice-encoding direction and frequency-encoding direction, respectively. Additionally, a rephasing gradient 230 is applied along the phase-encoding direction. As is well known in the art, this rephasing gradient 230 has the same size and shape, but opposite polarity, of the phase-encoding gradient 208. The pulse sequence is repeated a number of times with the phase-encoding gradient 208 being stepped through successive values in each repetition to acquire a data set as an array of complex echo signal samples.

In MRE, visualization of a propagating shear wave field is achieved by acquiring phase contrast MRE images at multiple time points. These time points are usually chosen so as to be offset by a fraction of the period of the shear wave, in which the fraction is calculated to be:

$$\left(\frac{1}{n}\right) \cdot T; \tag{3}$$

where T is the period of the shear wave, and n is the number of images. In this manner, the sequence of images are spaced substantially equally throughout the wave cycle and represent a temporal sample of the propagating wave. Typically, a temporal Fourier transform is then performed at each pixel to extract the motion at the excitation frequency of the shear wave. The result of this temporal Fourier transform is referred to as the complex wave image. This information is then provided to an inversion algorithm to estimate shear stiffness.

Figure 3:
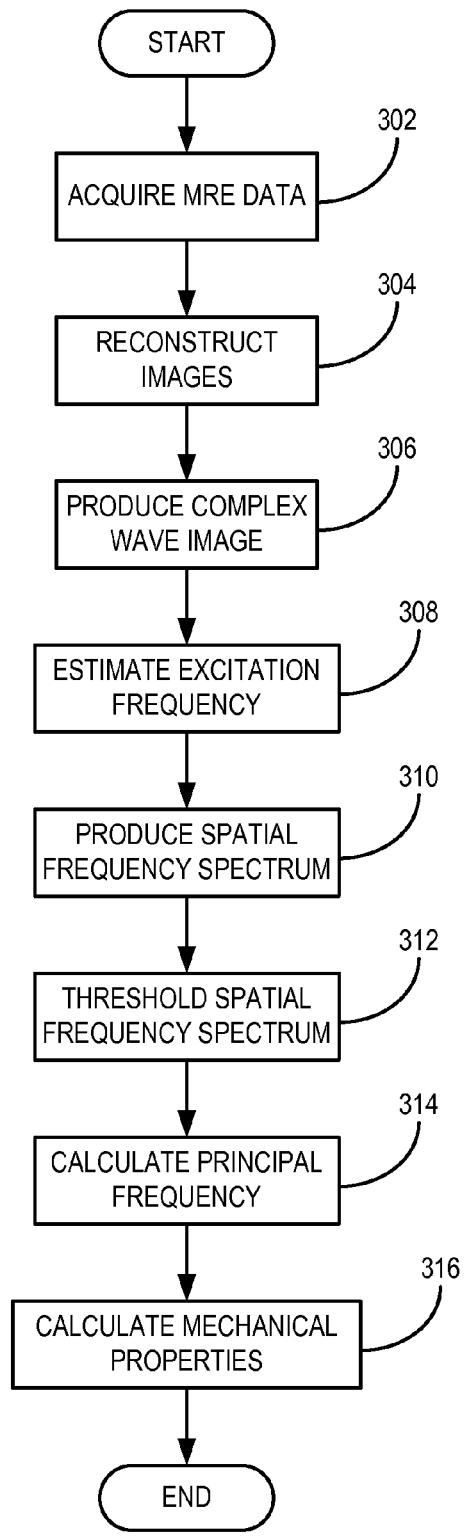
FIG. 3 is a flowchart of an exemplary method for calculating mechanical properties of a material from MRE data having low SNR.

Referring now to FIG. 3, a method for estimating shear stiffness using MRE data having low signal-to-noise ratio ("SNR") is illustrated. The method begins by acquiring MRE data with an MRI system, as indicated at step 302. For example, the pulse sequence illustrated in FIG. 2 may be used to acquire the desired amount of MRE data. The MRE data may include, for example, motion-encoded MR signals. Images are then reconstructed from the acquired MRE data, as indicated at step 304. This image reconstruction is a conventional image reconstruction, such as a Fourier transform-based image reconstruction. Using the reconstructed images, a complex wave image is produced, as indicated at step 306. The complex wave image may be produced by filtering the images pixel-wise using a temporal Fourier transform. The complex wave image indicates the amplitude of the shear wave motion at the excitation frequency of the motion; thus, the excitation frequency can be estimated from the complex wave image, as indicated at step 308.

A spatial frequency spectrum is produced from the complex wave image next, as indicated at step 310. For example, a spatial two-dimensional Fourier transform is applied to the complex wave image to produce this spatial frequency spectrum. To aid in determining the principal frequency of the spatial frequency spectrum, the spatial frequency spectrum is thresholded, as indicated at step 312. By way of example, the peak amplitude of the spatial frequency spectrum is identified, and all spectral amplitude values that are below a predefined fraction of this peak amplitude are zeroed. The principal frequency of the spatial frequency spectrum is then identified from the thresholded spatial frequency spectrum, as indicated at step 314. By way of example, the principal frequency may be calculated as the weighted average of the radial spatial frequencies corresponding to spectrum amplitude values above the threshold:

$$\omega_{centroid} = \frac{\sum_{i \in \Omega} 2\pi f_i \cdot M(f_i)^2}{\sum_{i \in \Omega} M(f_i)^2};\qquad(4)$$

where $f_i$ is a spatial frequency in the spatial frequency spectrum; $M(f_i)$ is the magnitude of the spatial frequency spectrum at the spatial frequency, $f_i$; and $i \in \Omega$ indicates that the sum is over only those spatial frequency values, $f_i$, above the threshold. The principal frequency, $\omega_{centroid}$, is then used to calculate mechanical properties, as indicated at step 316. By way of example, the principal frequency may be used to calculate a principal wavelength, $\lambda_p$:

$$\lambda_p = \frac{1}{\omega_{centroid}};\qquad(5)$$

which may used along with the temporal excitation frequency, f, estimated in step 308 to calculate shear wave speed:

$$c = f\lambda_p\qquad(6);$$

which may be used to calculate shear stiffness:

$$\mu = \rho c^2\qquad(7).$$

It is noted that the foregoing approach does not calculate local stiffness values, but a single average value over a selected region-of-interest.

Calculation of shear stiffness requires the estimation of the physical density, $\rho$, of the material under investigation. In most solid organs this value is typically assumed to be approximately 1000 kilograms per cubic meter, or one gram per cubic centimeter. However, within the lung, the physical density is typically considered to be approximately one third of that of solid organs, and varies as a function of inflation volume and disease. Without the appropriate values for lung densities, both LFE and principal frequency inversion algorithms will incorrectly estimate lung shear stiffness. To estimate the density, a mono-exponential decay curve may be fitted to values of physical density versus inflation pressure for both inspiration and expiration. This exponential curve can be used to approximate the physical density of lung tissue for each inflation pressure.

A method for the quantification of average shear stiffness in very low SNR MRE data based on estimation of the principal frequency of the propagating shear wave is provided. It is contemplated that the provided principal frequency method is much less sensitive to decreases in phase-contrast SNR than is LFE, particularly when wavelengths are long compared to object dimensions. The provided method is well suited to estimating the shear stiffness of normal lung parenchyma.

While the provided principal frequency estimation technique is less sensitive to very low SNR, local information may be lost because a single estimate of shear stiffness is calculated. This is useful for comparisons with global estimates of lung stiffness, and is, therefore, more applicable to the evaluation of those lung diseases in which the assumption of a homogeneous medium, at least regionally, is valid, such as in diffuse diseases including pulmonary fibrosis. However, it is possible to achieve a compromise between the size of the region-of-interest over which the principal frequency estimation method is performed and the degree of regional information obtained. For example, rather than selecting a region-of-interest that includes the entire lung, each lobe of each lung could be potentially divided into four quadrants over which the principal frequency estimation method may be applied to provide four separate regional estimates of shear stiffness. However, it is contemplated that the regions-of-interest should remain large enough that the convolution in frequency space with the Fourier transform of the window does not bias the weighted average used to calculate the principal frequency.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for calculating a mechanical property of a material using a magnetic resonance imaging (MRI) system, the steps of the method comprising:
   a) acquiring with the MRI system, magnetic resonance elastography (MRE) data from a subject containing the material;
   b) reconstructing images from the MRE data acquired in step a);
   c) producing a complex wave image from the images reconstructed in step b);
   d) producing a spatial frequency spectrum from the complex wave image produced in step c);
   e) calculating a principal frequency of the spatial frequency spectrum produced in step d); and
   f) calculating a mechanical property of the material using the complex wave image produced in step c) and the principal frequency calculated in step e).

2. The method as recited in claim 1 in which step f) includes estimating an excitation frequency from the complex wave image and using the excitation frequency and principal frequency calculated in step e) to calculate the mechanical property.

3. The method as recited in claim 1 in which step e) includes calculating a weighted average of magnitude values of the spatial frequency spectrum produced in step d).

4. The method as recited in claim 3 in which calculating the weighted average includes weighting spatial frequency values by a square of a magnitude of the spatial frequency spectrum at the corresponding spatial frequency value.

5. The method as recited in claim 3 in which step e) includes thresholding the spatial frequency spectrum prior to calculating the weighted average.

6. The method as recited in claim 3 in which at least some of the images reconstructed in step b) are indicative of low amplitude shear waves.

7. The method as recited in claim 1 in which step c) includes temporally filtering the reconstructed images pixel-wise.

8. The method as recited in claim 1 in which step d) includes spatially Fourier transforming the complex wave image.

9. A magnetic resonance imaging (MRI) system, comprising:
   a magnet system configured to generate a polarizing magnetic field about at least a portion of a subject positioned in the MRI system;
   a plurality of gradient coils configured to establish a magnetic field gradient about at least a portion of the subject positioned in the MRI system;

a radio frequency (RF) coil configured to apply an RF field to at least a portion of the subject and to receive magnetic resonance (MR) signals therefrom;

a computer system programmed to:
- direct the plurality of gradient coils and the RF coil to perform a pulse sequence that acquires motion-encoded MR signals from the subject;
- reconstruct images from the acquired motion-encoded MR signals;
- produce a spatial frequency spectrum from the reconstructed images;
- calculate a principal frequency of the produced spatial frequency spectrum; and
- calculate a mechanical property of a tissue in the subject using the reconstructed wave images and the calculated principal frequency.

10. The magnetic resonance imaging system as recited in claim 9 in which the computer system is further configured to:
- produce a complex wave image by temporally filtering the reconstructed images; and
- produce the spatial frequency spectrum by transforming the complex wave image.

11. The magnetic resonance imaging system as recited in claim 10 in which the computer system is further configured to:
- estimate an excitation frequency from the complex wave image; and
- calculate the mechanical property of the tissue using the estimated excitation frequency and the calculated principal frequency.

12. The magnetic resonance imaging system as recited in claim 9 in which the computer system is further configured to threshold the spatial frequency spectrum and to calculate the principal frequency from the thresholded spatial frequency spectrum.

13. The magnetic resonance imaging system as recited in claim 9 in which the computer system is configured to calculate the principal frequency by calculating a weighted average of spatial frequency values in the spatial frequency spectrum.

14. The magnetic resonance imaging system as recited in claim 13 in which the computer system is configured to calculate the weighted average by weighting each spatial frequency value by a square of a magnitude of the spatial frequency spectrum at the corresponding spatial frequency value.

15. The magnetic resonance imaging system as recited in claim 14 in which the computer system is configured to:
- threshold the spatial frequency spectrum; and
- calculate the weighted average using those spatial frequency values in the thresholded spatial frequency spectrum.

* * * * *